(12) United States Patent
Ando et al.

(10) Patent No.: US 10,833,019 B2
(45) Date of Patent: *Nov. 10, 2020

(54) DUAL METAL-INSULATOR-SEMICONDUCTOR CONTACT STRUCTURE AND FORMULATION METHOD

(71) Applicants: INTERNATIONAL BUSINESS MACHINES CORPORATION, Armonk, NY (US); GlobalFoundries, Inc., Grand Cayman (KY)

(72) Inventors: Takashi Ando, Eastchester, NY (US); Hiroaki Niimi, Cahoes, NY (US); Tenko Yamashita, Schenectady, NY (US)

(73) Assignees: INTERNATIONAL BUSINESS MACHINES CORPORATION, Armonk, NY (US); GLOBALFOUNDRIES, INC. (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/668,409

(22) Filed: Oct. 30, 2019

(65) Prior Publication Data
US 2020/0066638 A1 Feb. 27, 2020

Related U.S. Application Data

(60) Continuation of application No. 16/040,752, filed on Jul. 20, 2018, now Pat. No. 10,535,606, which is a
(Continued)

(51) Int. Cl.
H01L 29/78 (2006.01)
H01L 23/535 (2006.01)
(Continued)

(52) U.S. Cl.
CPC ...... *H01L 23/535* (2013.01); *H01L 21/02164* (2013.01); *H01L 21/02178* (2013.01);
(Continued)

(58) Field of Classification Search
CPC . H01L 23/532; H01L 23/485; H01L 23/5283; H01L 23/535; H01L 23/528;
(Continued)

(56) References Cited

U.S. PATENT DOCUMENTS 8,110,877 B2  2/2012  Mukherjee et al.
8,143,676 B2  3/2012  Inumiya et al.
(Continued)

OTHER PUBLICATIONS

Agrawal, Ashish, et al.; "A Unified Model for Insulator Selectiion to Form Ultra-Low Resistivity Metal-Insulator-Semiconductor Contacts to n—Si, n—Ge, and n—InGaAs"; Applied Physics Letters; vol. 101; 042108-1-042108-4; 2012.
(Continued)

*Primary Examiner* — Chuong A Luu
(74) *Attorney, Agent, or Firm* — Cantor Colburn LLP

(57) ABSTRACT

A method of making a semiconductor device includes forming a first source/drain trench and a second source/drain trench over a first and second source/drain region, respectively; forming a first silicon dioxide layer in the first source/drain trench and a second silicon dioxide layer in the second source/drain trench; forming a first source/drain contact over the first source/drain region, the first source/drain contact including a first tri-layer contact disposed between the first silicon dioxide layer and a first conductive material; and forming a second source/drain contact over the second source/drain region, the second source/drain contact including a second tri-layer contact disposed between the second silicon dioxide layer and a second conductive material; wherein the first tri-layer contact includes a first metal oxide layer in contact with the first silicon dioxide layer, and
(Continued)

the second tri-layer contact includes a second metal oxide layer in contact with the second silicon dioxide layer.

20 Claims, 11 Drawing Sheets

Related U.S. Application Data continuation of application No. 15/623,691, filed on Jun. 15, 2017, now Pat. No. 10,056,334, which is a division of application No. 14/862,894, filed on Sep. 23, 2015, now Pat. No. 9,735,111.

(51) Int. Cl.
| | |
|---|---|
| *H01L 27/092* | (2006.01) |
| *H01L 21/8238* | (2006.01) |
| *H01L 21/02* | (2006.01) |
| *H01L 21/768* | (2006.01) |
| *H01L 29/51* | (2006.01) |
| *H01L 23/485* | (2006.01) |
| *H01L 21/285* | (2006.01) |
| *H01L 29/66* | (2006.01) |

(52) U.S. Cl.
CPC ...... *H01L 21/02192* (2013.01); *H01L 21/285* (2013.01); *H01L 21/76802* (2013.01); *H01L 21/76831* (2013.01); *H01L 21/76832* (2013.01); *H01L 21/76846* (2013.01); *H01L 21/76877* (2013.01); *H01L 21/823871* (2013.01); *H01L 23/485* (2013.01); *H01L 27/092* (2013.01); *H01L 29/517* (2013.01); *H01L 29/66545* (2013.01)

(58) Field of Classification Search
CPC ............... H01L 23/5329; H01L 27/092; H01L 27/0924; H01L 29/517; H01L 29/51; H01L 29/66; H01L 29/45; H01L 29/78; H01L 29/417; H01L 29/452; H01L 29/41758; H01L 29/456; H01L 29/785; H01L 29/66545; H01L 29/66568; H01L 29/66522; H01L 29/6656
USPC ........................................................ 257/373
See application file for complete search history.

(56) References Cited

U.S. PATENT DOCUMENTS

| | | | |
|---|---|---|---|
| 8,373,199 B2 | 2/2013 | Ng et al. | |
| 8,872,172 B2 | 10/2014 | Cheng et al. | |
| 8,927,418 B1 | 1/2015 | Lin et al. | |
| 8,941,184 B2 | 1/2015 | Ando et al. | |
| 9,018,709 B2 | 4/2015 | Takeoka | |
| 9,240,480 B2 | 1/2016 | Xu | |
| 9,287,138 B2 | 3/2016 | Wang | |
| 9,589,851 B2 | 3/2017 | Bu et al. | |
| 9,735,111 B2 | 8/2017 | Ando et al. | |
| 10,056,334 B2 | 8/2018 | Ando et al. | |
| 10,153,201 B2 | 12/2018 | Bu et al. | |
| 10,535,606 B2 * | 1/2020 | Ando | H01L 21/823871 |
| 2006/0046391 A1 | 3/2006 | Tang et al. | |
| 2010/0155846 A1 | 6/2010 | Mukherjee et al. | |
| 2010/0320510 A1 | 12/2010 | Loh et al. | |
| 2013/0241008 A1 | 9/2013 | Choi et al. | |
| 2014/0124842 A1 | 5/2014 | Wang et al. | |
| 2014/0264494 A1 | 9/2014 | Xu | |
| 2014/0264634 A1 | 9/2014 | Lee | |
| 2015/0035073 A1 | 2/2015 | Ando et al. | |
| 2015/0187896 A1 | 7/2015 | Kamineni et al. | |
| 2015/0279957 A1 | 10/2015 | Wang et al. | |
| 2016/0104646 A1 | 4/2016 | Hung | |
| 2016/0148846 A1 | 5/2016 | Ok et al. | |
| 2016/0181380 A1 | 6/2016 | Joshi et al. | |
| 2018/0331040 A1 | 11/2018 | Ando et al. | |

OTHER PUBLICATIONS

Coss, Brian E., et al.; "CMOS Band-Edge Schottky Barrier Heights Using Dielectric-Dipole Mitigated (DDM) Metal/Si for Source/Drain Contact Resistance Reduction"; 2009 Symposium on VLSI Technology Digest of Technical Papers; p. 104-105; 2009.

Liao, M.-H., et al.; "Experimental Demonstration on the Ultra-Low Source/Drain Resistance by Metal-Insulator-Semiconductor Contact Structure in In0.53Ga0.47AS Field-Effect Transistors"; AIP Advances; vol. 3; 092118-1-092118-5; 2013.

Lin, J.-Y. Jason, et al.; "Reduction in Specific Contact Resistivity to n+ Ge Using TiO2 Interfacial Layer"; IEEE Electron Device Letters; vol. 33, No. 11; p. 1541-1543; Nov. 2012.

List of IBM Patents or Patent Applications Treated as Related; (Appendix P), Filed Oct. 30, 2019; 2 pages.

Majumdar, Kausik, et al; "Contact Resistance Improvement by Dielectric Breakdown in Semiconductor-Dielectric-Metal Contact"; Applied Physics Letters; vol. 102; p. 113505-1-113505-4; 2013.

Manik, Prashanth Paramahans, et al.; Fermi-Level Unpinning and Low Resistivity in Contacts to n-type Ge with a Thin ZnO Interfacial Layer; Applied Physics Letters; vol. 101; p. 182105-1-182105-5; 2012.

\* cited by examiner

DUAL METAL-INSULATOR-SEMICONDUCTOR CONTACT STRUCTURE AND FORMULATION METHOD

DOMESTIC PRIORITY

This application is a continuation of and claims priority from U.S. application Ser. No. 16/040,752, filed Jul. 20, 2018, which is a continuation and claims priority from U.S. patent application Ser. No. 15/623,691, filed on Jun. 15, 2017, issued as U.S. Pat. No. 10,056,334, which is a division of and claims priority from U.S. patent application Ser. No. 14/862,894, filed on Sep. 23, 2015, issued as U.S. Pat. No. 9,735,111, the entire contents of both applications are incorporated herein by reference.

BACKGROUND

The present invention relates to metal-oxide-semiconductor field-effect transistors (MOSFET), and more specifically, to source/drain contact structures in MOSFET devices.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

SUMMARY

According to an embodiment, a method of making a semiconductor device includes forming a first source/drain trench over a first source/drain region in a first transistor and a second source/drain trench over a second source/drain region in a second transistor; forming a first silicon dioxide layer in the first source/drain trench and a second silicon dioxide layer in the second source/drain trench; forming a first source/drain contact over the first source/drain region, the first source/drain contact including a first tri-layer contact disposed between the first silicon dioxide layer and a first conductive material; and forming a second source/drain contact over the second source/drain region, the second source/drain contact including a second tri-layer contact disposed between the second silicon dioxide layer and a second conductive material; wherein the first tri-layer contact includes a first metal oxide layer in contact with the first silicon dioxide layer, and the second tri-layer contact includes a second metal oxide layer in contact with the second silicon dioxide layer.

According to another embodiment, a method of making a semiconductor device includes forming a first source/drain trench over a first source/drain region in a first transistor and a second source/drain trench over a second source/drain region in a second transistor; forming a first silicon dioxide layer in the first source/drain trench and a second silicon dioxide layer in the second source/drain trench; disposing a first metal oxide layer onto the first silicon dioxide layer and along a first sidewall of the first source/drain trench and over the second silicon dioxide layer and along a sidewall of the second source/drain trench; removing the first metal oxide layer from the second source/drain trench; disposing a second metal oxide layer followed by a conductive liner layer over the first metal oxide layer within the first source/drain trench and directly onto the second silicon dioxide layer and along the sidewall of the second source/drain trench; removing by a selective process, the second metal oxide layer and the conductive liner layer from the first source/drain trench; and filling the first source/drain trench and the second source/drain trench with a conductive material.

Yet, according to another embodiment, a semiconductor device includes a first transistor comprising a first substrate, a first source/drain region positioned over the first substrate, and a first source/drain contact defined over the first source drain region, the first source/drain contact including a first tri-layer contact disposed between a first silicon dioxide layer disposed directly over the first source/drain region and a first conductive material; and a second transistor including a second substrate, a second source/drain region positioned over the second substrate, and a second source/drain contact defined over the second source drain region, the second source/drain contact including a second tri-layer contact disposed between a second silicon dioxide layer disposed directly over the second source/drain region and a second conductive material; wherein the first tri-layer contact including a first metal oxide layer in contact with the first silicon dioxide layer, and the second tri-layer contact includes a second metal oxide layer in contact with the second silicon dioxide layer.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-9B illustrate exemplary methods of making semiconductor devices according to various embodiments, in which:

FIG. 1 is a cross-sectional side view of a first transistor and a second transistor with a silicon dioxide layer and first liner layer disposed within source/drain trenches;

FIG. 2 is a cross-sectional side view after disposing a mask over the second transistor and removing the first liner layer from the first transistor;

FIG. 3 is a cross-sectional side view after removing the mask and disposing a first metal oxide layer within the source/drain trenches;

FIG. 4 is a cross-sectional side view after disposing a second liner layer over the metal oxide layer;

FIG. 5 is a cross-sectional side view after disposing a mask over the first transistor and removing the first liner layer, first metal oxide layer, and the second liner layer from the second transistor;

FIG. 6 is a cross-sectional side view after removing the mask and disposing a second metal oxide layer and a second liner layer within the source/drain trenches of the first and second transistors;

FIG. 7 is a cross-sectional side view after disposing a mask over the second transistor and selectively removing the second metal oxide layer and second liner layer from the first transistor;

FIG. 9B is a cross-sectional side view after performing a planarization process.

DETAILED DESCRIPTION

Figure 1:
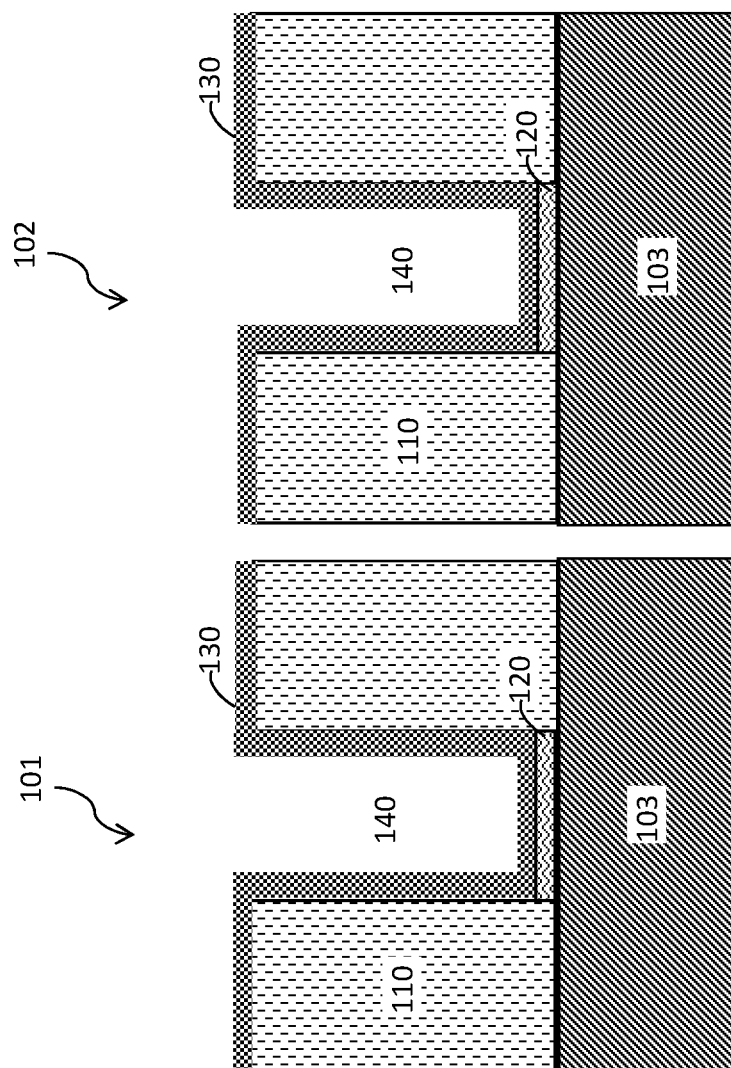

As the dimensions of semiconductor devices scale down, the contact area of the device source/drain regions decrease. The smaller contact areas may result in increased resistance. Metal silicide materials may be used to form source/drain contacts. However, depending on the type of substrate, forming a metal silicide may be challenging.

Accordingly, various embodiments described herein include semiconductor devices with two transistors having different source/drain contacts that provide reduced contact resistance. The different source/drain contacts in the two transistors are formed simultaneously. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1-9B illustrate exemplary methods of making semiconductor devices according to various embodiments. FIG. 1 is a cross-sectional side view of a first transistor 101 and a second transistor 102. The first transistor 101 and the second transistor 102 are different transistors. In one embodiment, the first transistor 101 is a PFET, and the second transistor 102 is an NFET. The first transistor 101 and the second transistor may be FinFET devices, planar transistor devices, or any other type of semiconductor devices.

The first transistor 101 and the second transistor 102 include a substrate 103. The substrate 103 of the first transistor 101 can be the same or different than the substrate 103 of the second transistor 102. Non-limiting examples of suitable substrate 103 materials include silicon, silicon germanium, or other suitable substrate material.

The substrate 103 may be doped with an n-type dopant or a p-type dopant, depending on the type of transistor, to form source/drain regions. Non-limiting examples of suitable n-type dopants include phosphorus and arsenic. Non-limiting examples of suitable p-type dopants include boron and gallium.

In one embodiment, the first transistor 101 is a PFET, and the substrate 103 includes silicon germanium doped with boron. In another embodiment, the second transistor 102 is an NEFT, and the substrate 103 includes silicon doped with phosphorus.

An interlayer dielectric (ILD) layer 110 is disposed over the substrate 103 and patterned to form source/drain trenches 140. The ILD layer 110 may be formed from, for example, a low-k dielectric oxide, including but not limited to, silicon dioxide, spin-on-glass, a flowable oxide, a high density plasma oxide, borophosphosilicate glass (BPSG), or any combination thereof. The ILD layer 140 is deposited by a suitable deposition process, including, but not limited to chemical vapor deposition (CVD), physical vapor deposition (PVD), plasma enhanced CVD, atomic layer deposition (ALD), evaporation, chemical solution deposition, or other like processes.

To pattern the ILD layer 110, a resist, for example, a photoresist (not shown) is disposed over the ILD layer 110. The ILD layer 110 may also be patterned using any suitable lithography process. When the resist is a photoresist, the resist is patterned by exposure to a desired pattern of radiation. The exposed photoresist is developed with a resist developer to provide a patterned photoresist over the ILD layer 110. At least one etching process is employed to transfer the pattern from the patterned photoresist into ILD layer 110. The etching process may be a dry etch process (e.g., reactive ion etching (RIE), plasma etching, ion beam etching, or laser ablation). The etching process may be a wet chemical etch (e.g., with potassium hydroxide or sulfuric acid and hydrogen peroxide). Both dry etching and wet chemical etching processes may be used. After transferring the pattern through the ILD layer 110 to form the source/drain trenches 140, the patterned photoresist is removed utilizing resist stripping processes, for example, ashing. A first source/drain trench 140 is formed within the first source/drain trench 140 of the first transistor 101. A second source/drain trench 140 is formed within the second source/drain trench 140 of the second transistor 102.

A silicon dioxide layer 120 is formed within the source/drain trenches 140 and over the source/drain regions within the substrate 103. The silicon dioxide layer 120 may be formed using a chemical oxidation process. The silicon dioxide layer 120 is formed by an ex situ or an in situ oxidation process. During ex situ oxidation, an aqueous chemical oxidation process forms the silicon dioxide layer 120. During in situ oxidation, the source/drain trench 140 is exposed to an oxidant, such as ozone, before depositing a high-k dielectric material.

The thickness of the silicon dioxide layer 120 generally varies and is not intended to be limited. In one aspect, the thickness of the silicon dioxide layer 120 is in a range from about 0.1 nm to about 1.5 nm. In another aspect, the thickness of the silicon dioxide layer 120 is in a range from about 0.3 nm to about 0.8 nm.

A first liner layer 130 is disposed as a conformal layer within the source/drain trenches 140. The first liner layer 130 is disposed directly over the silicon dioxide layer 120, along a sidewall of the source/drain trenches 140 within the first transistor 101 and the second transistor 102, and over the ILD layer 110. In some embodiments, the first liner layer 130 is optional.

The first liner layer 130 may include a low contact resistance material or other suitable conductive liner material. Non-limiting examples of suitable materials for the first liner 130 include titanium nitride, tantalum nitride, tungsten, or any combination thereof. The first liner layer 130 may be formed as a single layer or multi layers of one or more materials.

The first liner layer 130 is formed using any suitable deposition process. Non-limiting examples of suitable deposition methods for forming the first liner layer 130 include CVD, PVD, ALD, or other suitable deposition process.

The thickness of the first liner layer 130 generally varies and is not intended to be limited. In one aspect, the thickness of the first liner layer 130 is in a range from about 0.5 nm to about 5.0 nm. In another aspect, the thickness of the first liner layer 130 is in a range from about 1.0 nm to about 3.0 nm.

Figure 2:
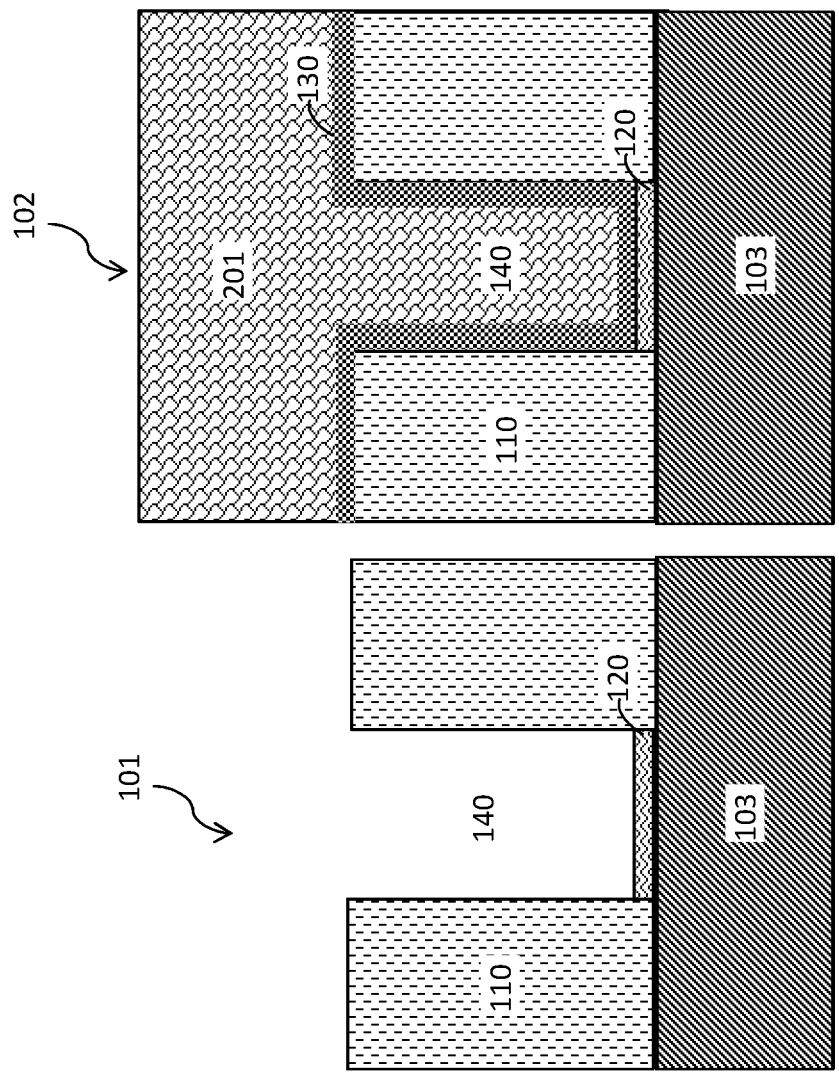

FIG. 2 is a cross-sectional side view after disposing a mask 201 (first mask) over the second transistor 102 and removing the first liner layer 130 from the first transistor 101. The mask 201 may be any suitable etch block mask material, for example, a resist. The mask 201 protects the second transistor 102 and is disposed as a conformal layer within the source/drain trench 140 of the second transistor 102. The mask 201 is formed over the first liner layer 130. Suitable materials for the mask 201 include photoresist materials, electron-beam resist materials, ion-beam resist materials, X-ray resist materials, and etchant resist materials. The mask 201 material may include a polymeric material that is formed by a spin-on process.

The first liner layer 130 is removed from the source/drain trench 140 of the first transistor 101 by an etching process. After removing the first liner layer 130, the silicon dioxide layer 120 is exposed in the first transistor 101. The etching process may include, for example, $NH_4OH$, $H_2O_2$, and $H_2O$, from room temperature up to 70° C.

Figure 3:
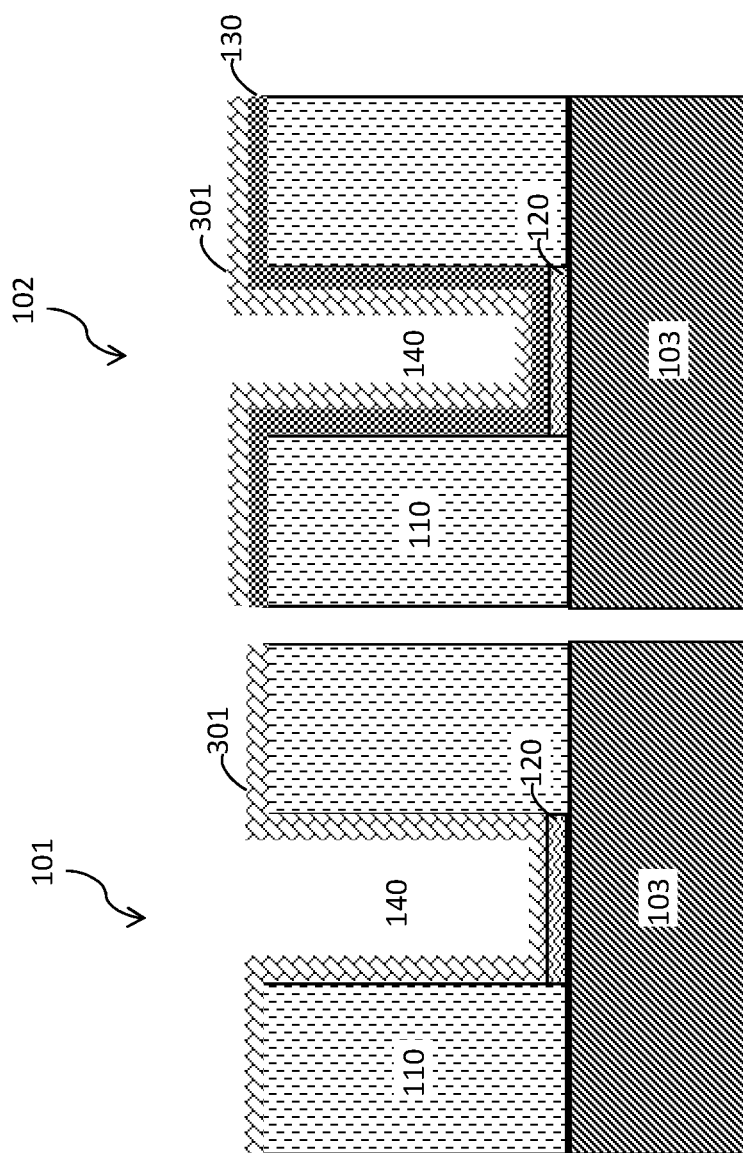

FIG. 3 is a cross-sectional side view after removing the mask 201 and disposing a first metal oxide layer 301 within the source/drain trenches 140 of the first transistor 101 and the second transistor 102. The first metal oxide layer 301 may be formed by an ALD technique. The first metal oxide layer 301 is deposited as a conformal layer within the source/drain trenches 140. In the first transistor 101, the first metal oxide layer 301 is disposed directly onto the silicon dioxide layer 120 and along a sidewall of the source/drain trench. In the second transistor 102, the first metal oxide layer 301 is disposed directly onto the first liner layer 130 and over the silicon dioxide layer 120.

To form the first metal oxide layer 301 by ALD, a metal precursor is flowed alternately with an oxidant, for example, $O_2$, $O_3$, or water. Suitable precursors and temperatures for thermal ALD are known in the art and can be used.

The type of metal oxide used for the first metal oxide layer 301 depends on the type of transistor. When the first transistor 101 is a PFET, the first metal oxide layer 301 may be aluminum oxide ($Al_2O_3$), titanium oxide ($TiO_2$), germanium oxide ($GeO_2$), or any combination thereof. When the first transistor 101 is an NFET, the first metal oxide layer 301 may be yttrium oxide ($Y_2O_3$), lutetium oxide ($Lu_2O_3$), lanthanum oxide ($La_2O_3$), strontium oxide (SrO), zirconium oxide ($ZrO_2$), hafnium oxide ($HfO_2$), magnesium oxide (MgO), or any combination thereof.

The first metal oxide layer 301 has a thickness in a range from about 0.1 nm to about 2.0 nm. In another aspect, the first metal oxide layer 301 has a thickness in a range from about 0.3 nm to about 0.8 nm.

Figure 4:
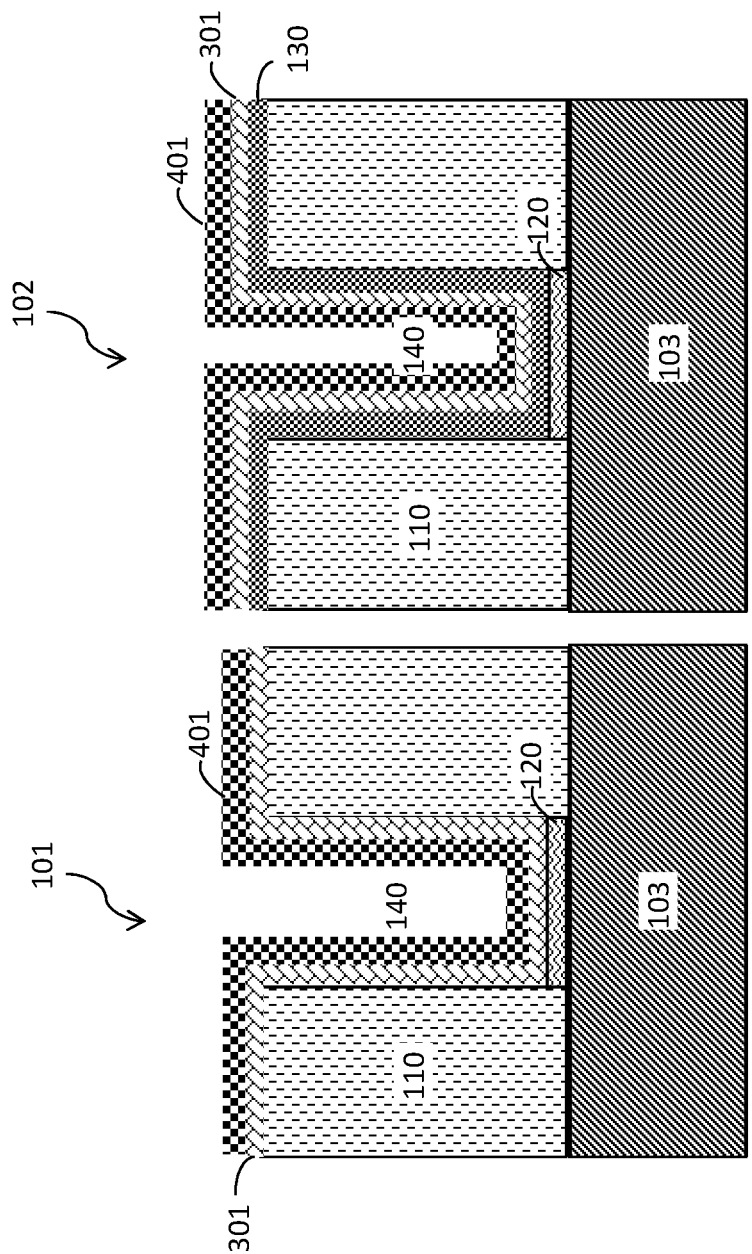

FIG. 4 is a cross-sectional side view after disposing a second liner layer 401 over the first metal oxide layer 301. The second liner layer 401 is disposed as a conformal layer over the first metal oxide layer 301 within the source/drain trenches 140 of the first and second transistors 101, 102. The second liner layer 130 may include a low contact resistance material or other suitable conductive liner material. Non-limiting examples of suitable materials for the second liner layer 401 include titanium nitride, tantalum nitride, tungsten, or any combination thereof. The second liner layer 401 may be formed as a single layer or multi layers of one or more materials. In some embodiments, the second liner layer 401 is optional.

The second liner layer 401 is formed using any suitable deposition process. Non-limiting examples of suitable deposition methods for forming the first liner layer 130 include CVD, PVD, ALD, or any combination thereof.

The thickness of the second liner layer 401 generally varies and is not intended to be limited. In one aspect, the thickness of the second liner layer 401 is in a range from about 0.5 nm to about 5.0 nm. In another aspect, the thickness of the second liner layer 401 is in a range from about 1.0 nm to about 3.0 nm.

Figure 5:
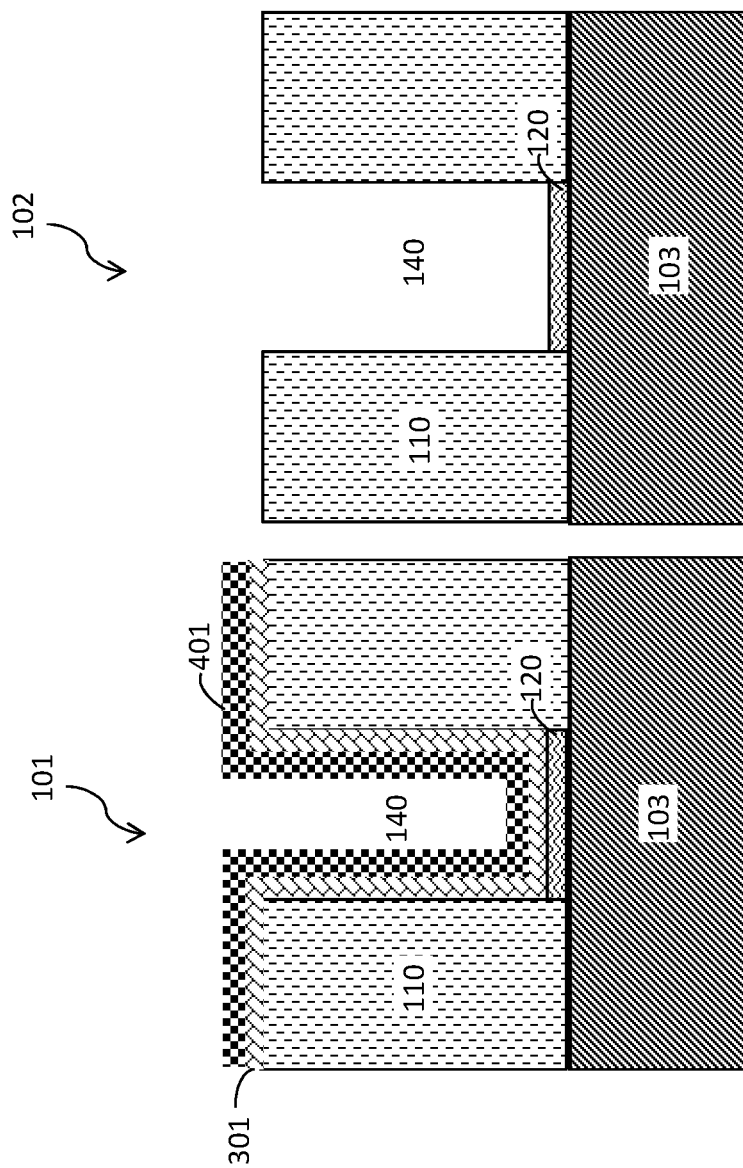

FIG. 5 is a cross-sectional side view after disposing a second mask (not shown) over the first transistor 101 and removing the first liner layer 130, the first metal oxide layer 301, and the second liner layer 401 from the source/drain trenches 140 of the second transistor 102. Any standard or suitable block mask and lithography processes may be used for the second mask. The first liner layer 130, the first metal oxide layer 301, and the second liner layer 401 are removed by an etching process. The etching process may include a three step process, for example, (1) a process that includes $NH_4OH$, $H_2O_2$, and $H_2O$, (2) a process that include dilute $HF:H_2O$ (1:100 to 1:500), and (3) a process that includes $NH_4OH$, $H_2O_2$, and $H_2O$.

After removing the first liner layer 130, the first metal oxide layer 301, and the second liner layer 401 from the second transistor 102, the silicon dioxide layer 120 is exposed. The first metal oxide layer 301 and the second liner layer 401 remain within the source/drain trenches 140 of the first transistor 101.

Figure 6:
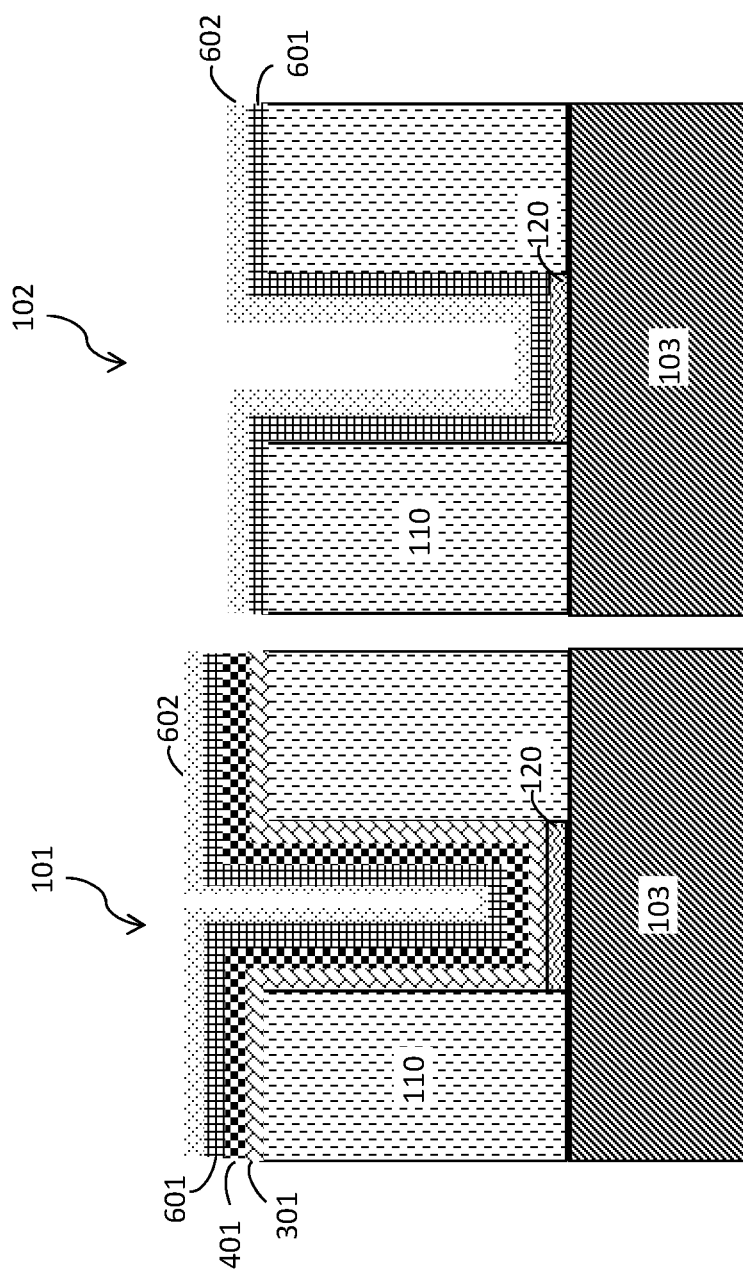

FIG. 6 is a cross-sectional side view after disposing a second metal oxide layer 601 and a third liner layer 602 within the source/drain trenches 140 of the first and second transistors 101, 102. The second metal oxide layer 601 may be formed by an ALD technique. The second metal oxide layer 601 is deposited as a conformal layer within the source/drain trenches 140. The second metal oxide layer 601 is disposed directly onto the second liner layer 401 within the source/drain trench 140 of the first transistor. The second metal oxide layer 601 is disposed directly onto the silicon dioxide layer 120, along a sidewall of the source/drain trench, and over the ILD layer 110 of the second transistor 102.

The type of metal oxide used for the second metal oxide layer 601 depends on the type of transistor. When the second transistor 102 is a PFET, the second metal oxide layer 601 may be aluminum oxide ($Al_2O_3$), titanium oxide ($TiO_2$), germanium oxide ($GeO_2$), or any combination thereof. When the second transistor 102 is an NFET, the second metal oxide layer 601 may be yttrium oxide ($Y_2O_3$), lutetium oxide ($Lu_2O_3$), lanthanum oxide ($La_2O_3$), strontium oxide (SrO), zirconium oxide ($ZrO_2$), hafnium oxide ($HfO_2$), magnesium oxide (MgO), or any combination thereof.

The second metal oxide layer 601 has a thickness in a range from about 0.1 to about 2.0 nm. In another aspect, the second metal oxide layer 601 has a thickness in a range from about 0.3 to about 0.8 nm.

The third liner layer 602 is disposed as a conformal layer directly onto the second metal oxide layer 601 within the source/drain trenches 140 of the first and second transistors 101, 102. In some embodiments, the third liner layer 602 may be optional. The third liner layer 602 may include a low contact resistance material or other suitable conductive liner material. Non-limiting examples of suitable materials for the third liner layer 602 include titanium nitride, tantalum nitride, tungsten, or any combination thereof. The third liner layer 602 may be formed as a single layer or multi layers of one or more materials.

The third liner layer 602 is formed using any suitable deposition process. Non-limiting examples of suitable deposition methods for forming the third liner layer 602 include CVD, PVD, ALD, or any combination thereof.

The thickness of the third liner layer 602 generally varies and is not intended to be limited. In one aspect, the thickness of the third liner layer 602 is in a range from about 0.5 nm to about 5.0 nm. In another aspect, the thickness of the third liner layer 602 is in a range from about 1.0 nm to about 3.0 nm.

Figure 7:
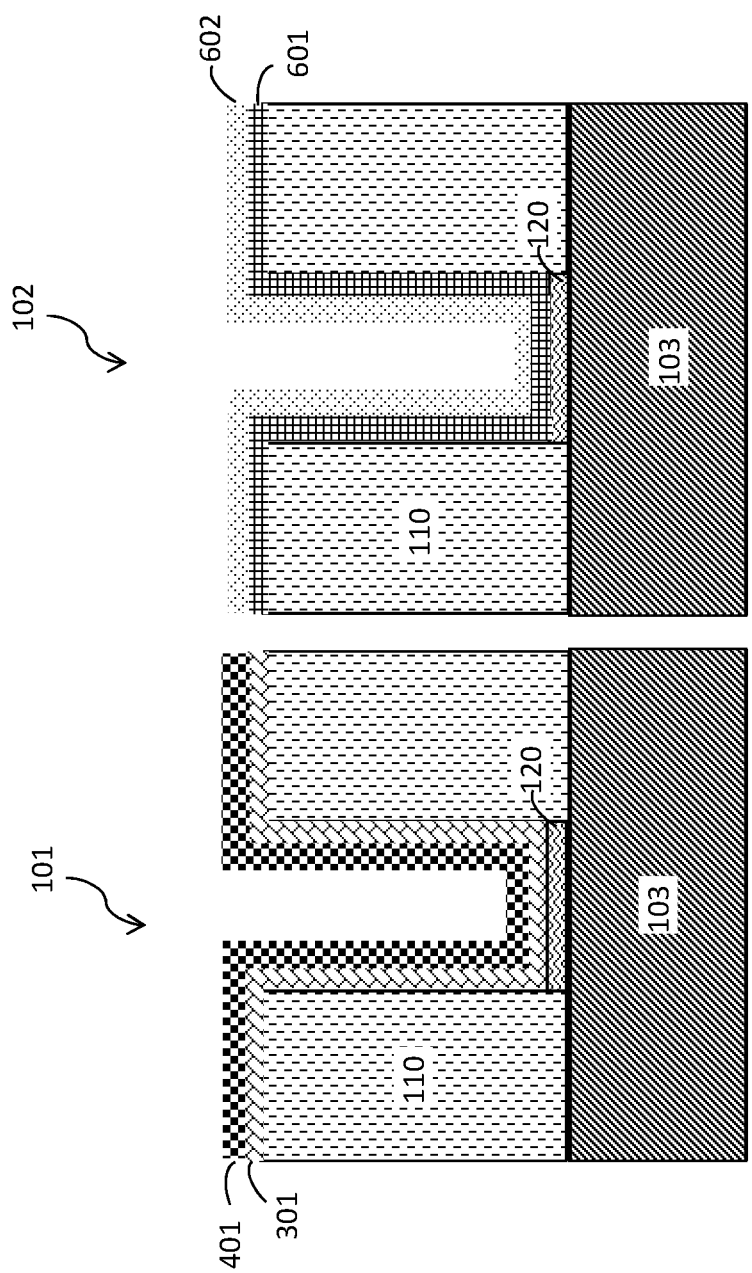

FIG. 7 is a cross-sectional side view after disposing a third mask (not shown) over the second transistor 102 and selectively removing the second metal oxide layer 601 and third liner layer 602 from the first transistor 101. The first metal oxide layer 301 and the second liner layer 401 remains substantially intact in the first transistor 101. The mask protects the second transistor 102 during etching.

One or more etching processes may be used to selectively remove the third liner layer 602 and the second metal oxide layer 601 from the first transistor 101. A wet etching process that is selective for the third liner layer 602 material may be employed.

In one embodiment, the third liner layer 602 includes titanium nitride, and an etching process including $NH_4OH$, $H_2O_2$, and $H_2O$ ("SC1") is used to remove the third liner layer 602. A second selective etching process may then be used to remove the second metal oxide layer 601. In an exemplary embodiment, a hydrochloric acid etching process is used to remove the second metal oxide layer 601.

The mask (not shown) is removed by, for example, an ashing process. After removing the second metal oxide layer 601 and the third liner layer 602, the first transistor 101 includes the first metal oxide layer 301 disposed over the silicon dioxide layer 120. The second liner layer 401 is disposed over the first metal oxide layer 301. The second transistor 102 includes the second metal oxide layer 601 disposed over the silicon dioxide layer 120. The third liner layer 602 is disposed over the second metal oxide layer 601.

Figure 8A:
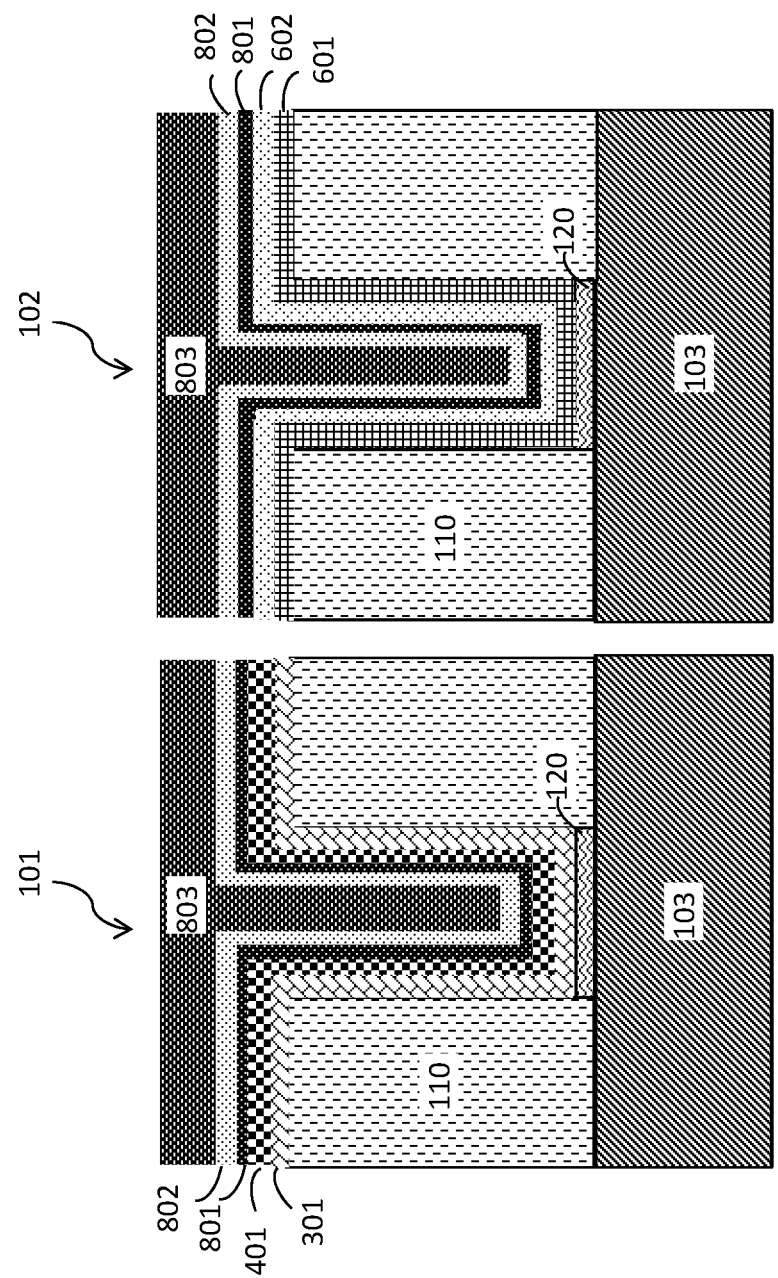
FIG. 8A is a cross-sectional side view after filling with source/drain trenches of the first and second transistors with a metal according to a first embodiment.
Figure 8B:
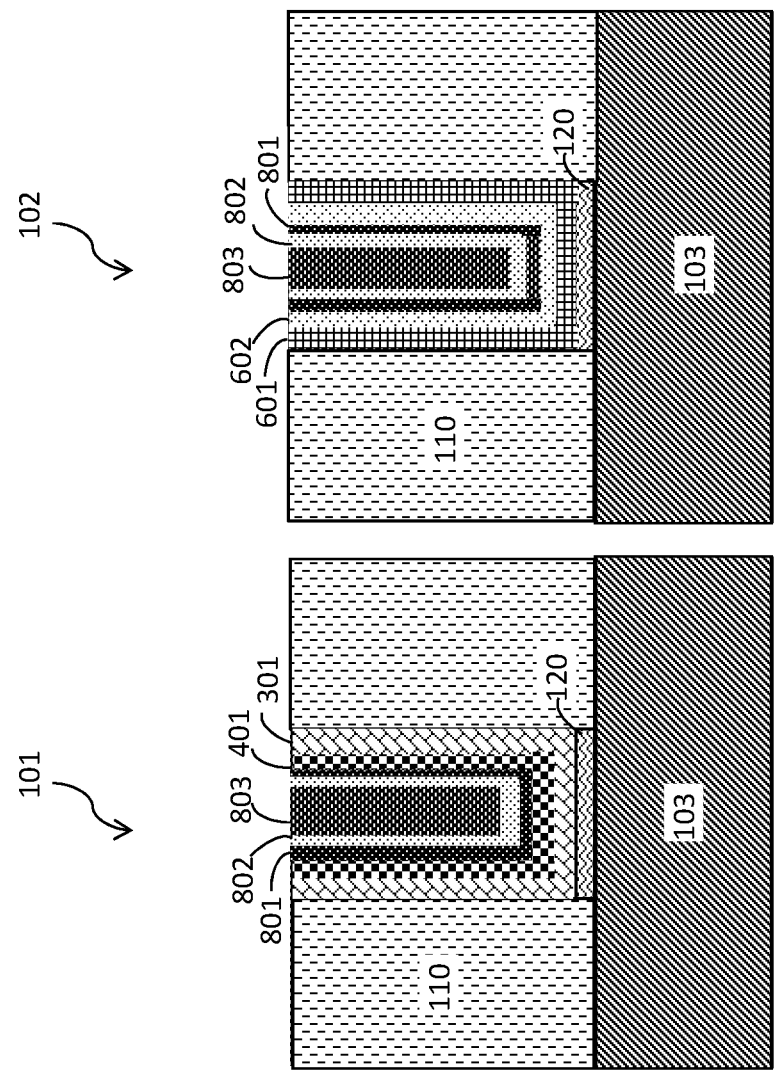
FIG. 8B is a cross-sectional side view after performing a planarization process.

FIGS. 8A and 8B illustrate a first exemplary embodiment following FIG. 7. FIG. 8A is a cross-sectional side view after filling the source/drain trenches 140 of the first and second transistors 101, 102 with a metal 803. The metal 803 (material) may be any suitable conductive metal. Non-limiting examples of suitable conductive metals/materials include aluminum, platinum, gold, tungsten, titanium, or any combination thereof. The 803 metal may be deposited by a deposition process, for example, CVD, PECVD, PVD, plating, thermal or e-beam evaporation, and sputtering.

One or more additional layers may be disposed between the metal 803 and the second liner layer 401 within the first transistor 101. One or more additional layers may be disposed between the metal 803 and the third liner layer 602 of the second transistor 102.

In one embodiment, first layer 801 and second layer 802 are disposed between the second liner layer 401 and the metal 803 of the first transistor 101. In another embodiment, first layer 801 and second layer 802 are disposed between the third liner layer 602 and the metal 803 of the second transistor 102. Non-limiting examples of suitable materials for first layer 801 include titanium, cobalt, aluminum, zirconium, hafnium, or any combination thereof. One non-limiting examples of a suitable material for second layer 802 includes titanium nitride.

In the first transistor 101, a four-layer contact including first metal oxide layer 301, second liner layer 401, first layer 801, and second layer 802 is formed between the silicon dioxide layer 120 and the metal 803. In the second transistor, a four-layer contact including second metal oxide layer 602, third liner layer 602, first layer 801, and second layer 802 is formed between the silicon dioxide layer 120 and metal 803.

FIG. 8B is a cross-sectional side view after performing a planarization process to polish the surface of the metal 803. The top surface of ILD layer 110 is exposed. The planarization process may include, for example, a chemical mechanical planarization (CMP) process.

Figure 9A:
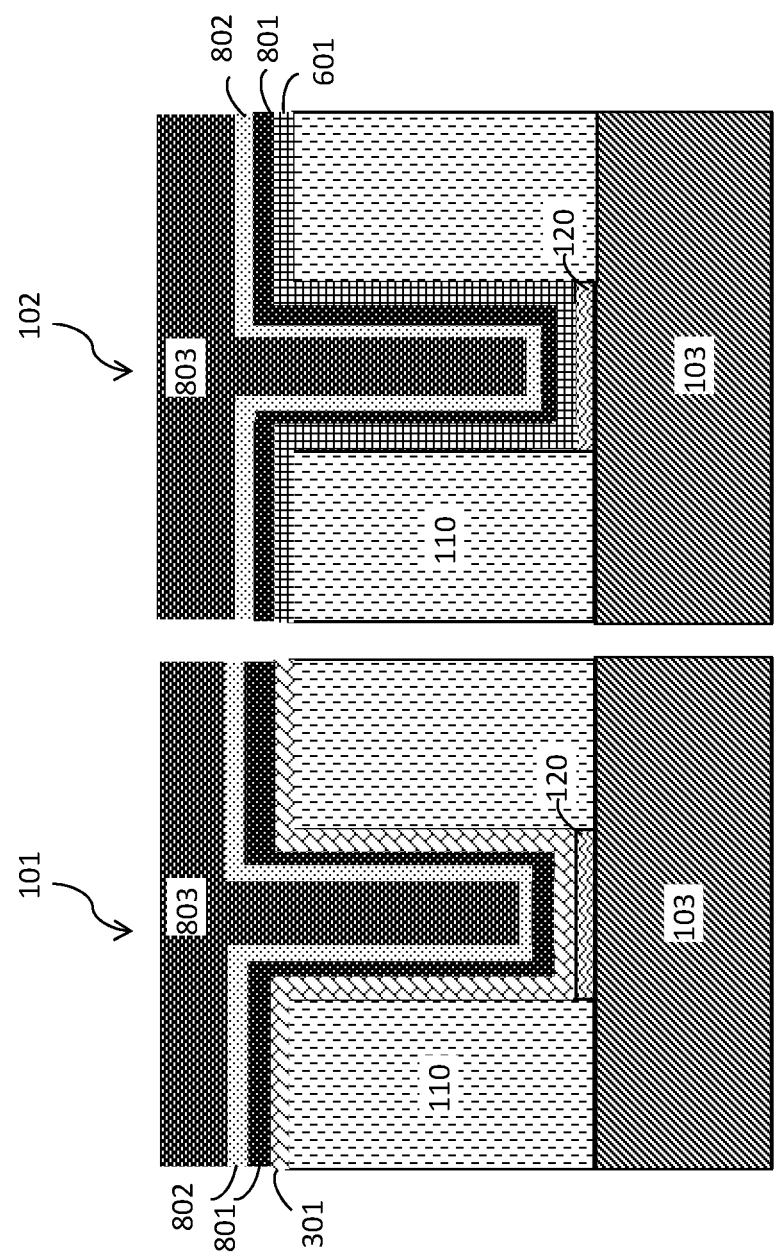
FIG. 9A is a cross-sectional side view after removing the first liner layer from the first and second transistors and filling the source/drain trenches with a metal according to a second embodiment.
Figure 9B:
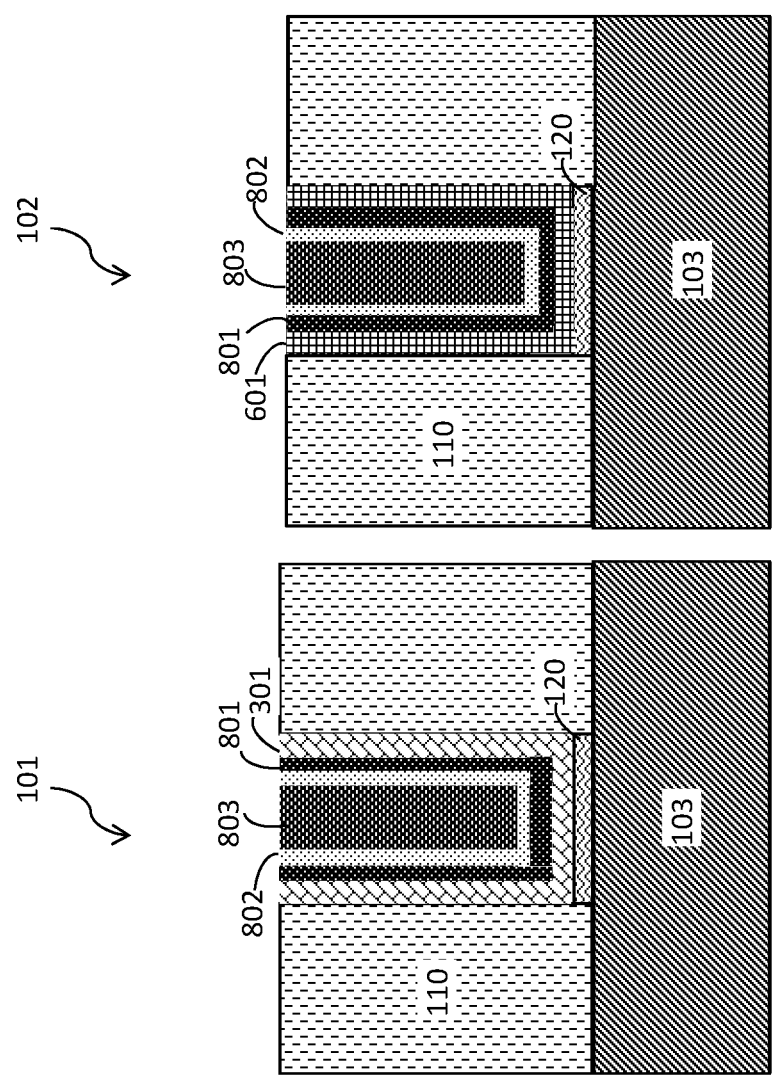

FIGS. 9A and 9B illustrate a second embodiment following FIG. 7. FIG. 9A is a cross-sectional side view after removing the second liner layer 401 from the first transistor 101 and the third liner layer 602 from the second transistor 102 of FIG. 7 before filling the source/drain trenches 140 with a metal 803.

One or more additional layers are disposed between the metal 803 and the first metal oxide layer 301 within the first transistor 101. One or more additional layers are disposed between metal 803 and the second metal oxide layer 601 of the second transistor 102. In one embodiment, first layer 801 and second layer 802 are disposed between the first metal oxide layer 301 and the metal 803 within the first transistor 101. In another embodiment, first layer 801 and second layer 802 are disposed between the second metal oxide layer 601 and the metal 803 of the second transistor 102.

In the first transistor 101, a tri-layer contact including first metal oxide layer 301, first layer 801, and second layer 802 is formed between the silicon dioxide layer 120 and the metal 803. In the second transistor, a tri-layer contact including second metal oxide layer 602, first layer 801, and second layer 802 is formed between the silicon dioxide layer 120 and metal 803.

FIG. 9B is a cross-sectional side view after performing a planarization process to polish the surface of the metal 803. The top surface of ILD layer 110 is exposed. The planarization process may be, for example, a CMP process.

As described above, various embodiments described herein include semiconductor devices with two transistors having different source/drain contacts that provide reduced contact resistance. The different source/drain contacts in the two transistors are formed simultaneously using a series of protective masks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a first transistor comprising a first source/drain contact comprising a first tri-layer contact disposed between a first silicon dioxide layer and a first conductive material; and
   a second transistor comprising a second tri-layer contact disposed between a second silicon dioxide layer and a second conductive material;
   wherein the first tri-layer contact comprises a first metal oxide layer in contact with the first silicon dioxide layer, and the second tri-layer contact comprises a second metal oxide layer in contact with the second silicon dioxide layer.

2. The semiconductor device of claim 1, wherein the first tri-layer contact further comprises a layer of titanium.

3. The semiconductor device of claim 2, wherein the first tri-layer contact further comprises a layer of titanium nitride.

4. The semiconductor device of claim 1, wherein the second tri-layer contact further comprises a layer of titanium disposed over the second metal oxide layer.

5. The semiconductor device of claim 4, further comprising a layer of titanium nitride disposed between the layer of titanium and the second conductive material.

6. The semiconductor device of claim 1, wherein the first metal oxide is aluminum oxide.

7. The semiconductor device of claim 1, wherein the second metal oxide is lanthanum oxide.

8. The semiconductor device of claim 1, wherein the first metal oxide layer is different than the second metal oxide layer.

9. The semiconductor device of claim 1, wherein the first metal oxide layer is aluminum oxide, titanium oxide, germanium oxide, or any combination thereof.

10. The semiconductor device of claim 1, wherein the second metal oxide layer is yttrium oxide, lutetium oxide, lanthanum oxide, strontium oxide, zirconium oxide, hafnium oxide, magnesium oxide, or any combination thereof.

11. A semiconductor device, comprising:
    a first source/drain contact comprising a first tri-layer contact disposed between a first silicon dioxide layer disposed directly over a first source/drain region and a first conductive material; and
    a second source/drain contact comprising a second tri-layer contact disposed between a second silicon dioxide layer disposed directly over a second source/drain region and a second conductive material;
    wherein the first tri-layer contact comprises a first metal oxide layer in contact with the first silicon dioxide layer, and the second tri-layer contact comprises a second metal oxide layer in contact with the second silicon dioxide layer.

12. The semiconductor device of claim 11, wherein the first tri-layer contact further comprises a layer of titanium.

13. The semiconductor device of claim 12, wherein the first tri-layer contact further comprises a layer of titanium nitride.

14. The semiconductor device of claim 11, wherein the second tri-layer contact further comprises a layer of titanium disposed over the second metal oxide layer.

15. The semiconductor device of claim 14, further comprising a layer of titanium nitride disposed between the layer of titanium and the second conductive material.

16. The semiconductor device of claim 11, wherein the first metal oxide is aluminum oxide.

17. The semiconductor device of claim 11, wherein the second metal oxide is lanthanum oxide.

18. The semiconductor device of claim 11, wherein the first metal oxide layer is different than the second metal oxide layer.

19. The semiconductor device of claim 11, wherein the first metal oxide layer is aluminum oxide, titanium oxide, germanium oxide, or any combination thereof.

20. The semiconductor device of claim 11, wherein the second metal oxide layer is yttrium oxide, lutetium oxide, lanthanum oxide, strontium oxide, zirconium oxide, hafnium oxide, magnesium oxide, or any combination thereof.

* * * * *